US010361120B2

(12) United States Patent
Wang et al.

(10) Patent No.: US 10,361,120 B2
(45) Date of Patent: Jul. 23, 2019

(54) CONDUCTIVE FEATURE FORMATION AND STRUCTURE

(71) Applicant: Taiwan Semiconductor Manufacturing Co., Ltd., Hsinchu (TW)

(72) Inventors: Yu Shih Wang, Tainan (TW); Chun-I Tsai, Hsinchu (TW); Shian Wei Mao, Taipei (TW); Ken-Yu Chang, Hsinchu (TW); Ming-Hsing Tsai, Chu-Pei (TW); Wei-Jung Lin, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/880,448

(22) Filed: Jan. 25, 2018

(65) Prior Publication Data

US 2019/0164823 A1 May 30, 2019

Related U.S. Application Data

(60) Provisional application No. 62/592,476, filed on Nov. 30, 2017.

(51) Int. Cl.
*H01L 21/4763* (2006.01)
*H01L 21/768* (2006.01)
*H01L 23/532* (2006.01)
*H01L 21/3213* (2006.01)

(52) U.S. Cl.
CPC .. *H01L 21/76847* (2013.01); *H01L 21/32134* (2013.01); *H01L 21/76846* (2013.01); *H01L 23/53223* (2013.01); *H01L 23/53238* (2013.01); *H01L 23/53252* (2013.01); *H01L 23/53266* (2013.01)

(58) Field of Classification Search
CPC ........ H01L 21/76847; H01L 21/32134; H01L 21/76846; H01L 21/53238; H01L 21/53252; H01L 21/53266
USPC .......................... 438/622, 627, 644, 927, 745
See application file for complete search history.

(56) References Cited

U.S. PATENT DOCUMENTS

| | | | |
|---|---|---|---|
| 6,232,228 B1 * | 5/2001 | Kwag .................... | C09K 13/04 216/100 |
| 6,624,066 B2 | 9/2003 | Lu et al. | |
| 6,878,620 B2 * | 4/2005 | Nguyen ............ | H01L 21/76829 257/E21.576 |
| 6,916,669 B2 * | 7/2005 | Jones ..................... | B82Y 10/00 257/E21.665 |

(Continued)

FOREIGN PATENT DOCUMENTS

| | | |
|---|---|---|
| KR | 20080060367 A | 7/2008 |
| KR | 20160119438 A | 10/2016 |

*Primary Examiner* — Nitin Parekh
(74) *Attorney, Agent, or Firm* — Slater Matsil, LLP

(57) ABSTRACT

Generally, the present disclosure provides example embodiments relating to conductive features, such as metal contacts, vias, lines, etc., and methods for forming those conductive features. In an embodiment, a barrier layer is formed along a sidewall. A portion of the barrier layer along the sidewall is etched back. After etching back the portion of the barrier layer, an upper portion of the barrier layer along the sidewall is smoothed. A conductive material is formed along the barrier layer and over the smoothed upper portion of the barrier layer.

20 Claims, 16 Drawing Sheets

(56) References Cited

U.S. PATENT DOCUMENTS

| | | | |
|---|---|---|---|
| 7,348,676 B2 * | 3/2008 | Lee | H01L 21/76802 |
| | | | 257/751 |
| 9,105,490 B2 | 8/2015 | Wang et al. | |
| 9,236,267 B2 | 1/2016 | De et al. | |
| 9,236,300 B2 | 1/2016 | Liaw | |
| 9,406,804 B2 | 8/2016 | Huang et al. | |
| 9,443,769 B2 | 9/2016 | Wang et al. | |
| 9,520,482 B1 | 12/2016 | Chang et al. | |
| 9,548,366 B1 | 1/2017 | Ho et al. | |
| 9,576,814 B2 | 2/2017 | Wu et al. | |
| 9,659,813 B1 | 5/2017 | Chang et al. | |
| 9,831,183 B2 | 11/2017 | Lin et al. | |
| 9,859,386 B2 | 1/2018 | Ho et al. | |
| 2003/0232494 A1 * | 12/2003 | Adams | H01L 21/31053 |
| | | | 438/622 |
| 2004/0092095 A1 * | 5/2004 | Nguyen | H01L 21/76829 |
| | | | 438/627 |
| 2005/0142861 A1 * | 6/2005 | Yeom | H01L 21/76802 |
| | | | 438/639 |
| 2006/0273380 A1 * | 12/2006 | Hshieh | H01L 24/26 |
| | | | 257/330 |
| 2007/0200237 A1 | 8/2007 | Matsumori | |
| 2008/0174017 A1 * | 7/2008 | Yang | H01L 21/7682 |
| | | | 257/751 |
| 2008/0206986 A1 * | 8/2008 | Preusse | H01L 21/76805 |
| | | | 438/653 |
| 2010/0295182 A1 | 11/2010 | Hirao et al. | |
| 2010/0301491 A1 * | 12/2010 | Yang | H01L 21/02063 |
| | | | 257/773 |
| 2012/0064713 A1 * | 3/2012 | Russell | H01L 21/02277 |
| | | | 438/653 |
| 2013/0280900 A1 | 10/2013 | Lai et al. | |
| 2014/0361381 A1 * | 12/2014 | Hung | H01L 29/458 |
| | | | 257/384 |
| 2016/0043035 A1 | 2/2016 | Lin et al. | |
| 2016/0233164 A1 | 8/2016 | Choi et al. | |

* cited by examiner

CONDUCTIVE FEATURE FORMATION AND STRUCTURE

PRIORITY CLAIM AND CROSS-REFERENCE

This application claims the benefit of and priority to U.S. Provisional Patent Application Ser. No. 62/592,476, filed on Nov. 30, 2017, entitled "Conductive Feature Formation and Structure," which is incorporated herein by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (e.g., the number of interconnected devices per chip area) has generally increased while geometry size (e.g., the smallest component (or line) that can be created using a fabrication process) has decreased. This scaling down process generally provides benefits by increasing production efficiency and lowering associated costs. However, scaling down has also led to challenges that may not have been presented by previous generations at larger geometries.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
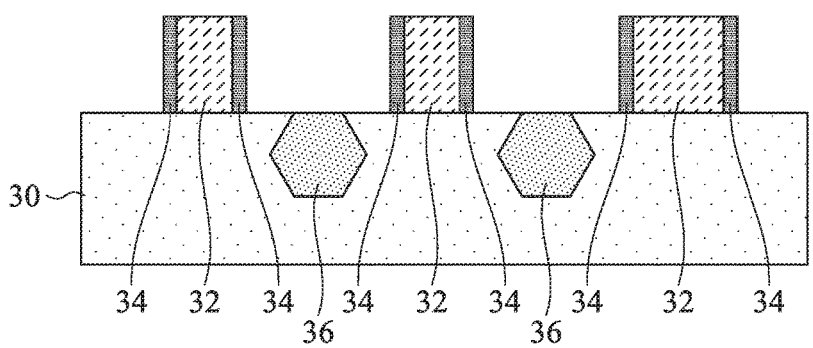
FIGS. 1 through 19 are cross-sectional views of respective intermediate structures during an example method for forming conductive features in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Generally, the present disclosure provides example embodiments relating to conductive features, such as metal contacts, vias, lines, etc., and methods for forming those conductive features. In some examples, a barrier layer and/or adhesion layer formed in an opening through a dielectric layer is pulled-back (e.g., etched) to have a height in the opening that is below the top surface of the dielectric. Some example processes for pulling back the barrier layer and/or adhesion layer can cause a constriction at an upper region of the opening, and accordingly, in some examples, a subsequent pull-back (e.g., etch) is performed to smooth the barrier layer and/or adhesion layer to reduce or remove the constriction. Among other things, this can permit a conductive material deposited on the barrier layer and/or adhesion layer to be deposited in the opening without having a void formed in the conductive material.

Example embodiments described herein are described in the context of forming conductive features in Front End Of the Line (FEOL), Middle End Of the Line (MEOL), and/or Back End Of the Line (BEOL) processing for transistors. Implementations of some aspects of the present disclosure may be used in other processes and/or in other devices. Some variations of the example methods and structures are described. A person having ordinary skill in the art will readily understand other modifications that may be made that are contemplated within the scope of other embodiments. Although method embodiments may be described in a particular order, various other method embodiments may be performed in any logical order and may include fewer or more steps than what is described herein. In some figures, some reference numbers of components or features illustrated therein may be omitted to avoid obscuring other components or features; this is for ease of depicting the figures.

FIGS. 1 through 19 illustrate cross-sectional views of respective intermediate structures during an example method for forming conductive features in accordance with some embodiments. FIG. 1 illustrates a semiconductor substrate 30 with at least portions of devices formed thereon. The semiconductor substrate 30 may be or include a bulk semiconductor, a semiconductor-on-insulator (SOI) substrate, or the like, which may be doped (e.g., with a p-type or an n-type dopant) or undoped. Generally, an SOI substrate comprises a layer of a semiconductor material formed on an insulator layer. The insulator layer may be, for example, a buried oxide (BOX) layer, a silicon oxide layer, or the like. The insulator layer is provided on or is a substrate, typically a silicon or glass substrate. Other substrates, such as a multi-layered or gradient substrate may also be used. In some embodiments, the semiconductor material of the semiconductor substrate may include an elemental semiconductor like silicon (Si) and germanium (Ge); a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or a combination thereof.

As illustrated in the figures and described herein, the devices are Field Effect Transistors (FETs), which may be planar FETs or Fin FETs (FinFETs). In other implementations, the devices can include Vertical Gate All Around (VGAA) FETs, Horizontal Gate All Around (HGAA) FETs, bipolar junction transistors (BJTs), diodes, capacitors, inductors, resistors, etc. In accordance with planar FETs and/or FinFETs, gate stacks 32 are formed on active areas of the semiconductor substrate 30. In planar FETs, the active areas can be a portion at the top surface of the semiconductor substrate 30 delineated by isolation regions. In FinFETs, the active areas can be three-dimensional fins protruding from between isolation regions on the semiconductor substrate 30.

The gate stacks 32 can be operational gate stacks like in a gate-first process or can be dummy gate stacks like in a replacement gate process. Each gate stack 32 can comprise a dielectric layer over the active area, a gate layer over the dielectric layer, and, in some instances, a mask layer over the gate layer. The dielectric layer, gate layer, and mask layer for the gate stacks 32 may be formed by sequentially forming or depositing the respective layers, and then patterning those layers into the gate stacks 32. For example, in a gate-first process or a replacement gate process, the dielectric layer may include or be silicon oxide, silicon nitride, the like, or multilayers thereof; the gate layer may include or be silicon (e.g., polysilicon) or another material; and the mask layer may include or be silicon nitride, silicon oxynitride, silicon carbon nitride, the like, or a combination thereof. In a gate-first process, for example, the dielectric layer (e.g., gate dielectric) may include or be a high-k dielectric material, such as having a k value greater than about 7.0, which may include a metal oxide or silicate of Hf, Al, Zr, La, Mg, Ba, Ti, Pb, multilayers thereof, or a combination thereof, and the gate layer (e.g., gate electrode) may include or be a metal-containing material such as TiN, TaN, TaC, Co, Ru, Al, multi-layers thereof, or a combination thereof. Processes for forming or depositing the dielectric layer, gate layer, and mask layer include thermal and/or chemical growth, Chemical Vapor Deposition (CVD), Plasma-Enhanced CVD (PECVD), Molecular-Beam Deposition (MBD), Atomic Layer Deposition (ALD), Physical Vapor Deposition (PVD), and other deposition techniques.

The layers for the gate stacks 32 may then be patterned to be the gate stacks 32, for example, using photolithography and one or more etch processes. For example, a photo resist can be formed on the mask layer (or gate layer, for example, if no mask layer is implemented), such as by using spin-on coating, and can be patterned by exposing the photo resist to light using an appropriate photomask. Exposed or unexposed portions of the photo resist may then be removed depending on whether a positive or negative resist is used. The pattern of the photo resist may then be transferred to the layers of the gate stacks 32, such as by using one or more suitable etch processes. The one or more etch processes may include a reactive ion etch (RIE), neutral beam etch (NBE), the like, or a combination thereof. The etching may be anisotropic. Subsequently, the photo resist is removed in an ashing or wet strip processes, for example.

Gate spacers 34 are formed along sidewalls of the gate stacks 32 (e.g., sidewalls of the dielectric layer, gate layer, and mask layer) and over the active areas on the semiconductor substrate 30. The gate spacers 34 may be formed by conformally depositing one or more layers for the gate spacers 34 and anisotropically etching the one or more layers, for example. The one or more layers for the gate spacers 34 may include or be silicon nitride, silicon oxynitride, silicon carbon nitride, the like, multi-layers thereof, or a combination thereof, and the etch process can include a RIE, NBE, or another etching process.

Source/drain regions 36 are formed in the active regions on opposing sides of a gate stack 32. In some examples, the source/drain regions 36 are formed by implanting dopants into the active areas using the gate stacks 32 and gate spacers 34 as masks. Hence, source/drain regions 36 can be formed by implantation on opposing sides of each gate stack 32. In other examples, the active areas may be recessed using the gate stacks 32 and gate spacers 34 as masks, and epitaxial source/drain regions 36 may be epitaxially grown in the recesses. Epitaxial source/drain regions 36 may be raised in relation to the active area. The epitaxial source/drain regions 36 may be doped by in situ doping during the epitaxial growth and/or by implantation after the epitaxial growth. Hence, source/drain regions 36 can be formed by epitaxial growth, and possibly with implantation, on opposing sides of each gate stack 32. Example dopants for source/drain regions 36 can include or be, for example, boron for a p-type device and phosphorus or arsenic for an n-type device, although other dopants may be used. The source/drain regions 36 may have a dopant concentration in a range from about $10^{19}$ cm$^{-3}$ to about $10^{21}$ cm$^{-3}$.

Figure 2:
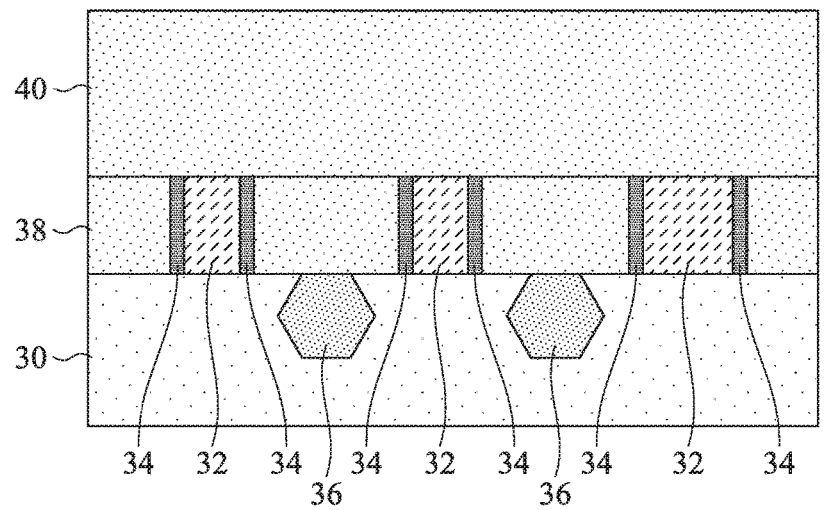

FIG. 2 illustrates the formation of a first interlayer dielectric (ILD) 38 and a second ILD 40. The first ILD 38 and second ILD 40 may each include an etch stop layer (ESL) and a principal dielectric layer such as a low-k dielectric layer, for example. Generally, an etch stop layer can provide a mechanism to stop an etching process when forming, e.g., contacts or vias. An etch stop layer may be formed of a dielectric material having a different etch selectivity from adjacent layers, for example, the principal dielectric layer of the ILD.

The first ILD 38 is deposited over the active areas, gate stacks 32, and gate spacers 34. For example, the etch stop layer may be conformally deposited over the active areas, gate stacks 32, and gate spacers 34. The etch stop layer may comprise or be silicon nitride, silicon carbon nitride, silicon carbon oxide, carbon nitride, the like, or a combination thereof, and may be deposited by CVD, PECVD, ALD, or another deposition technique. Then, for example, the principal dielectric layer is deposited over the etch stop layer. The principal dielectric layer may comprise or be silicon dioxide, a low-k dielectric material (e.g., a material having a dielectric constant lower than silicon dioxide), such as silicon oxynitride, phosphosilicate glass (PSG), borosilicate glass (BSG), borophosphosilicate glass (BPSG), undoped silicate glass (USG), fluorinated silicate glass (FSG), organosilicate glasses (OSG), $SiO_xC_y$, Spin-On-Glass, Spin-On-Polymers, silicon carbon material, a compound thereof, a composite thereof, the like, or a combination thereof. The principal dielectric layer may be deposited by spin-on, CVD, Flowable CVD (FCVD), PECVD, PVD, or another deposition technique.

The first ILD 38 can be planarized after being deposited. A planarization process, such as a Chemical Mechanical Polish (CMP), may be performed to planarize the first ILD 38. In some processes, such as in a gate-first process, the top surface of the first ILD 38 may be above top surfaces of the gate stacks 32. In other processes, such as a replacement gate process, the top surface of the first ILD 38 is planarized to be coplanar with top surfaces of the gate stacks 32 to thereby expose the gate stacks 32 through the first ILD 38. In such process, the planarization may remove the mask layer of the gate stacks 32 (and, in some instances, upper portions of the gate spacers 34), and accordingly, top surfaces of the gate layer of the gate stacks 32 are exposed through the first ILD 38.

In a replacement gate process, the gate stacks 32 exposed through the first ILD 38 can be removed and replaced with other gate stacks 32. Once exposed through the first ILD 38, the gate layer and dielectric layer of the gate stacks 32 are removed, such as by one or more etch processes. The gate layer may be removed by an etch process selective to the gate layer, wherein the dielectric layer can act as an etch stop layer, and subsequently, the dielectric layer can be removed by a different etch process selective to the dielectric layer. The etch processes can be, for example, a RIE, NBE, a wet etch, or another etch process. Replacement gate stacks can be formed as the gate stacks 32 where the gate stacks 32 were removed. The replacement gate stacks 32 can each include one or more conformal layers and a gate electrode over the one or more conformal layers. The one or more conformal layers include a gate dielectric layer and may include one or more work-function tuning layers.

The gate dielectric layer can be conformally deposited where the gate stacks 32 were removed (e.g., on surfaces of the active areas and sidewalls and top surfaces of the gate spacers 34) and on the top surface of the first ILD 38. The gate dielectric layer can be or include silicon oxide, silicon nitride, a high-k dielectric material, multilayers thereof, or other dielectric material. A high-k dielectric material may have a k value greater than about 7.0, and may include a metal oxide of or a metal silicate of Hf, Al, Zr, La, Mg, Ba, Ti, Pb, or a combination thereof. The gate dielectric layer can be deposited by ALD, PECVD, MBD, or another deposition technique.

Then, if implemented, a work-function tuning layer may be conformally deposited on the gate dielectric layer. The work-function tuning layer may include or be tantalum, tantalum nitride, titanium, titanium nitride, the like, or a combination thereof, and may be deposited by ALD, PECVD, MBD, or another deposition technique. Any additional work-function tuning layers may be sequentially deposited similar to the first work-function tuning layer.

A layer for the gate electrodes is formed over the one or more conformal layers. The layer for the gate electrodes can fill remaining regions where the gate stacks 32 were removed. The layer for the gate electrodes may be or comprise a metal-containing material such as Co, Ru, Al, W, Cu. multi-layers thereof, or a combination thereof. The layer for the gate electrodes can be deposited by ALD, PECVD, MBD, PVD, or another deposition technique.

Portions of the layer for the gate electrodes and the one or more conformal layers above the top surface of the first ILD 38 are removed. For example, a planarization process, like a CMP, may remove the portions of the layer for the gate electrodes and the one or more conformal layers above the top surface of the first ILD 38. The replacement gate stacks 32 comprising the gate electrodes and one or more conformal layers may therefore be formed.

The second ILD 40 is deposited over the first ILD 38. For example, the etch stop layer may be conformally deposited over the first ILD 38. Then, for example, the principal dielectric layer is deposited over the etch stop layer. The etch stop layer and principal dielectric layer of the second ILD 40 can be or include the same or similar materials and can be deposited using the same or similar techniques as described above with respect to the first ILD 38. The second ILD 40 can be planarized, such as by a CMP, after being deposited.

Figure 3:
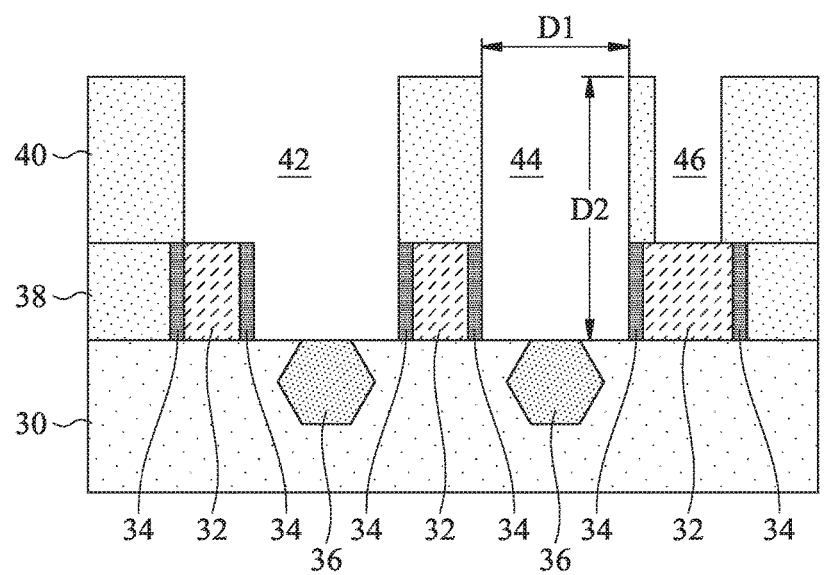

FIG. 3 illustrates the formation of openings 42, 44, and 46 through the second ILD 40 and the first ILD 38. The first opening 42 exposes a gate stack 32 and an adjoining source/drain region 36. The first opening 42 is therefore for forming a butted conductive feature between the exposed gate stack 32 and adjoining source/drain region 36. The second opening 44 exposes a source/drain region 36, and is therefore for forming a conductive feature to the exposed source/drain region 36. The third opening 46 exposes a gate stack 32, and is therefore for forming a conductive feature to the exposed gate stack 32. The openings 42, 44, and 46 may be formed using, for example, appropriate photolithography and etching processes. As an example, the opening 44 can have a first dimension D1 (e.g., a width) in a range from about 10 nm to about 50 nm, and can have a second dimension D2 (e.g., a height) in a range from about 50 nm to about 200 nm. An aspect ratio of the opening 44 (e.g., a ratio of the second dimension D2 to the first dimension D1) can be in a range from about 2 to about 4.

Figure 4:
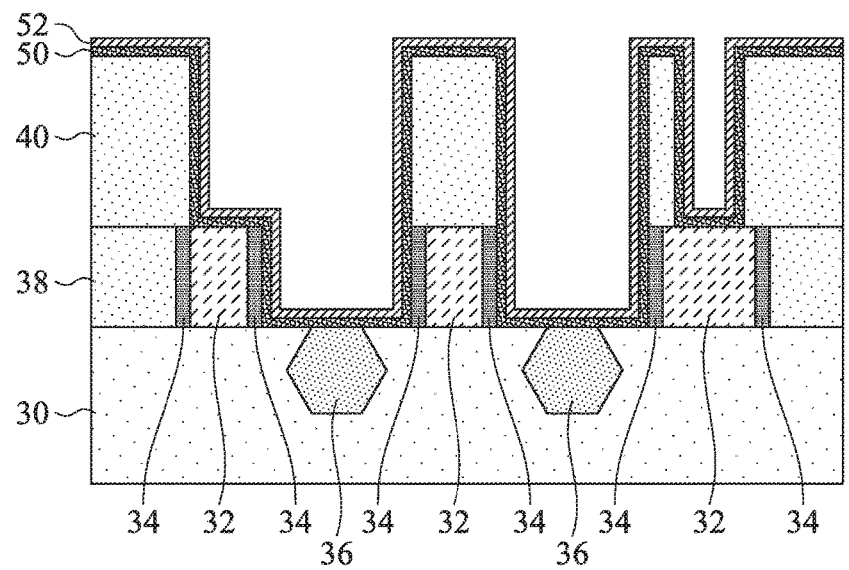

FIG. 4 illustrates the formation of an adhesion layer 50 conformally in the openings 42, 44, and 46, and a barrier layer 52 on the adhesion layer 50. The adhesion layer 50 layer is conformally deposited in the openings 42, 44, and 46, such as on the exposed source/drain regions 36, exposed gate stacks 32, sidewalls of the first ILD 38 and second ILD 40, and the top surface of the second ILD 40. The barrier layer 52 is conformally deposited on the adhesion layer 50. The adhesion layer 50 may be or comprise, for example, titanium, cobalt, nickel, the like or a combination thereof, and may be deposited by ALD, CVD, or another deposition technique. The barrier layer 52 may be or comprise titanium nitride, titanium oxide, tantalum nitride, tantalum oxide, the like, or a combination thereof, and may be deposited by ALD, CVD, or another deposition technique. Silicide regions may be formed on upper portions of the source/drain regions 36 by reacting upper portions of the source/drain regions 36 with the adhesion layer 50 and/or barrier layer 52. An anneal can be performed to facilitate the reaction of the source/drain regions 36 with the adhesion layer 50 and/or barrier layer 52. In a particular example, the adhesion layer 50 is a layer of titanium, and the barrier layer 52 is a layer of titanium nitride. The adhesion layer 50 and barrier layer 52 may have various thicknesses as described below following further processing.

Figure 5:
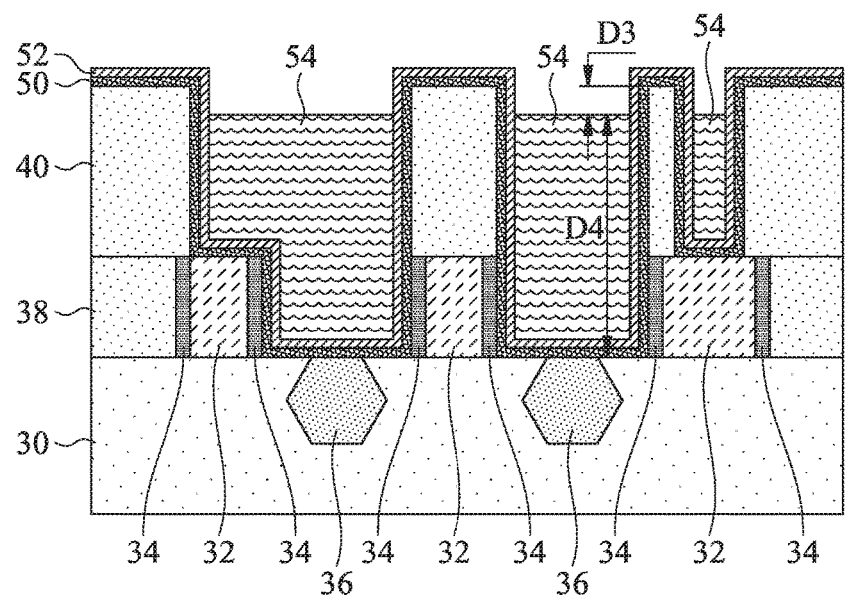

FIG. 5 illustrates the formation of a Bottom Anti-Reflection Coating (BARC) 54 in the openings 42, 44, and 46 over the barrier layer 52. The BARC 54 may be, for example, an organic material or another material deposited by spin-coating or another deposition technique. The BARC 54 may be initially deposited in the openings 42, 44, and 46 and to a level above the top surface of the second ILD 40 and/or above top surfaces of the barrier layer 52. The BARC 54 may subsequently be etched back to have top surfaces below the top surface of the second ILD 40. The BARC 54 may be etched back to a third dimension D3 below the top surface of the second ILD 40, which third dimension D3 can be in a range from about 15 nm to about 40 nm. Further, a fourth dimension D4 is from a bottom surface of the opening 44 (e.g., a surface of the active area to which the opening 44 is formed) to the top surface of the BARC 54. A ratio of the fourth dimension D4 to the second dimension D2 is less than 1, such as less that about 0.7, and more particularly, in a range from about 0.3 to about 0.7.

The etch back may be or include a dry (e.g., plasma) etch process. The plasma etch process may include a RIE, NBE, ICP etch, the like, or a combination thereof. Example etchant gases that can be used for a plasma etch process include argon (Ar) gas or another etchant gas. A flow rate of the etchant gas(es) of a plasma etch process may be in a range from about 2000 sccm to about 5000 sccm. A plasma etch process may implement a DC substrate bias in a range from about 100 kV to about 300 kV. A power of a plasma etch process may be in a range from about 500 W to about 1500 W. A pressure of a plasma etch process may be in a range from about 3 mtorr to about 5 mtorr. The depth of the etch back (e.g., the third dimension D3) can be controlled by a duration of the etch process used for the etch back. A duration of a plasma etch process can be in a range from about 15 seconds to about 120 seconds.

Figure 6:
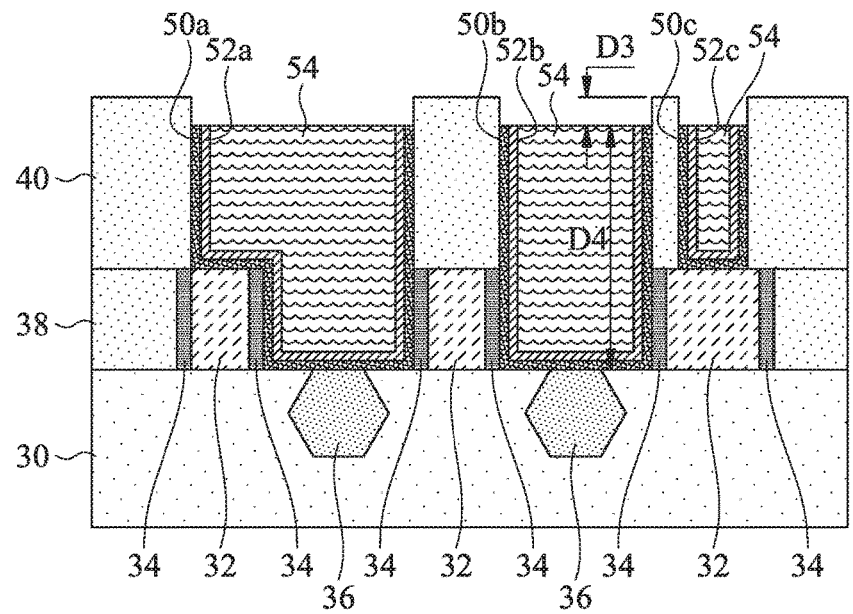

FIG. 6 illustrates the pulling back (e.g., removal by etching) of portions of the barrier layer 52 and the adhesion layer 50 above the top surfaces of the BARC 54 and at upper regions of the openings 42, 44, and 46. By removing the portions of the barrier layer 52 and the adhesion layer 50 above the top surfaces of the BARC 54 and at upper regions of the openings 42, 44, and 46, first, second, and third conductive feature adhesion layers 50a, 50b, and 50c and first, second, and third conductive feature barrier layers 52a, 52b, and 52c are formed in the first, second, and third openings 42, 44, and 46, respectively.

The portions of the barrier layer 52 and adhesion layer 50 may be removed using an etch process. The etch process can include a two-step wet etch process. A pre-treatment with a first wet etchant is performed. An example first wet etchant includes diluted hydrofluoric (dHF) acid. In some examples, the dHF may be diluted to about one part hydrofluoric (HF) acid to one hundred or more parts deionized water (DIW) (1:>=100, HF:DIW), such as in a range from about one part HF acid to one hundred parts DIW (1:100) to about one part HF acid to five hundred parts DIW (1:500). A second step etching with a second wet etchant is subsequently performed. Example second wet etchants include hydrofluoric (HF) acid, hydrogen peroxide ($H_2O_2$), ammonium hydroxide ($NH_4OH$), hydrochloric acid (HCl), a Standard Clean-1 (SC1), a Standard Clean-2 (SC2), the like, or a combination thereof, which may further be diluted in deionized water (DIW). For example, the second wet etchant can be a mixture of $NH_4OH$ or HCl with $H_2O_2$ and DIW at a ratio of 1:X:Y (($NH_4OH$ or HCl):$H_2O_2$:DIW), where X is in a range from about 1 to about 10, and Y is in a range from about 5 to about 120. A process time for the two-step wet etch process can be in a range from about 30 seconds to about 600 seconds, and a process temperature for the two-step wet etch process can be in a range from about 23° C. (e.g., room temperature) to about 67° C. The two-step wet etch process can be performed in situ in some examples. Other etch processes with different process parameters may be used.

The BARC 54 acts as a mask during the removal of the portions of the barrier layer 52 and the adhesion layer 50. Hence, top surfaces of, e.g., the second conductive feature adhesion layer 50b and second conductive feature barrier layer 52b can be at the third dimension D3 from the top surface of the second ILD 40 and/or at the fourth dimension D4 from the bottom surface of the opening 44. Further, the top surfaces of the second conductive feature adhesion layer 50b and second conductive feature barrier layer 52b can be at a position that has the ratio of the fourth dimension D4 to the second dimension D2.

Figure 7:
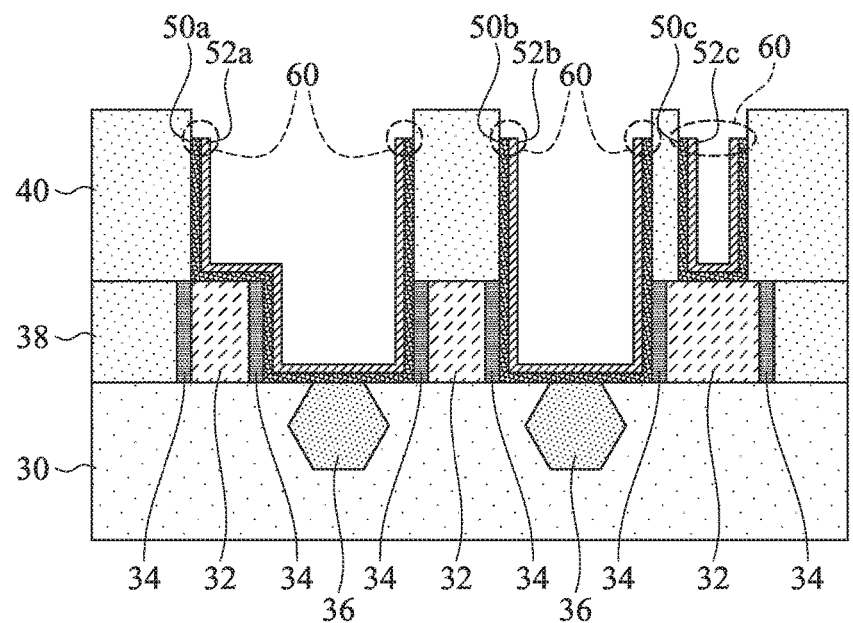

FIG. 7 illustrates the removal of the BARC 54. The BARC 54 may be removed by an ashing process, such as may use a plasma comprising oxygen ($O_2$), hydrogen ($H_2$), nitrogen ($N_2$), or another gas. After removal of the BARC 54, a residue and/or byproduct may be on upper surfaces of the conductive feature barrier layers 52a, 52b, and 52c interior to the respective openings 42, 44, and 46. The residue and/or byproduct are at profiles 60, an example of which is illustrated and described further with respect to FIG. 20 subsequently. The byproduct and/or residue may result from the removing (e.g., etching) of the portions of the barrier layer 52 and adhesion layer 50 in FIG. 6 and/or from the removing the BARC 54 in FIG. 7. The byproduct and/or residue can decrease a dimension of and/or constrict the respective openings 42, 44, and 46 at the upper portions of the conductive feature barrier layers 52a, 52b, and 52c. The first, second, and third conductive feature adhesion layers 50a, 50b, and 50c and first, second, and third conductive feature barrier layers 52a, 52b, and 52c may have various dimensions as described below with respect to FIG. 20.

Figure 8:
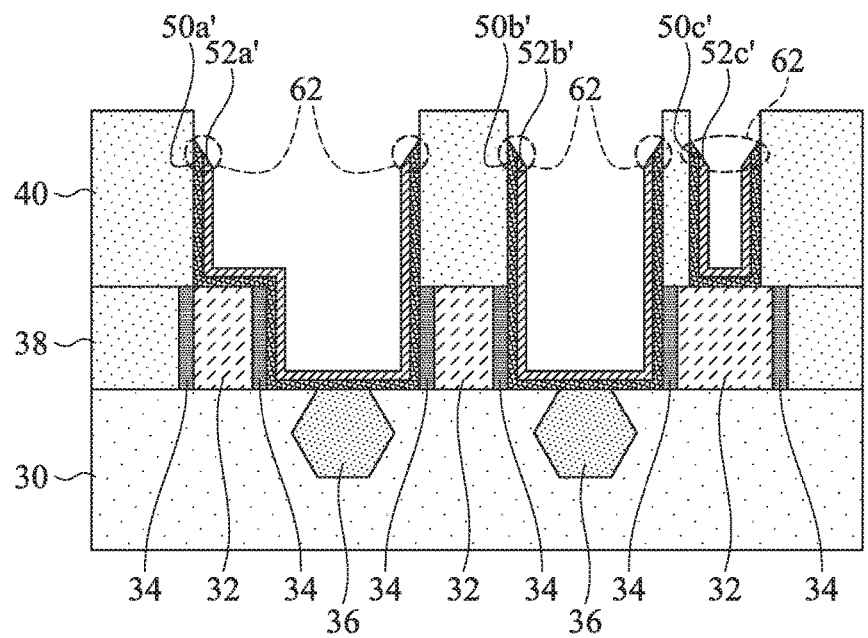

FIG. 8 illustrates subsequent pulling back (e.g., etching) of the conductive feature barrier layers 52a, 52b, and 52c and conductive feature adhesion layers 50a, 50b, and 50c to create modified conductive feature barrier layers 52a', 52b', and 52c' and modified conductive feature adhesion layers 50a', 50b', and 50c', respectively. The etching removes byproduct and/or residue from the surfaces of the upper portions of the conductive feature barrier layers 52a, 52b, and 52c, and can smooth (e.g., by tapering) the upper portions of the conductive feature barrier layers 52a, 52b, and 52c and conductive feature adhesion layers 50a, 50b, and 50c. The smoothing of the modified conductive feature barrier layers 52a', 52b', and 52c' and modified conductive feature adhesion layers 50a', 50b', and 50c' are at profiles 62, an example of which is illustrated and described further with respect to FIG. 21 subsequently. The etching can further tune heights of the modified conductive feature barrier layers 52a', 52b', and 52c' and modified conductive feature adhesion layers 50a', 50b', and 50c' (e.g., reducing the respective heights), such as by increasing a duration of the etching. The first, second, and third modified conductive feature adhesion layers 50a', 50b', and 50c' and first, second, and third modified conductive feature barrier layers 52a', 52b', and 52c' may have various dimensions as described below with respect to FIG. 21. The etching may be by a wet etch process, for example.

In some examples, the etching includes a two-step wet etch process. A pre-treatment with a first wet etchant is performed. An example first wet etchant includes diluted hydrofluoric (dHF) acid. In some examples, the dHF may be diluted to about one part hydrofluoric (HF) acid to one hundred or more parts deionized water (DIW) (1:>=100, HF:DIW), such as in a range from about one part HF acid to one hundred parts DIW (1:100) to about one part HF acid to five hundred parts DIW (1:500). A second step etching with a second wet etchant is subsequently performed. Example second wet etchants include hydrofluoric (HF) acid, hydrogen peroxide ($H_2O_2$), hydrochloric (HCl) acid, the like, or a combination thereof. In some examples, the second wet etchant may be diluted to about one part etchant to thirty or less parts DIW (1:<=30), such as in a range from about one part etchant to five parts DIW (1:5) to about one part etchant to thirty parts DIW (1:30). A process time for the two-step wet etch process can be in a range from about 30 seconds to about 300 seconds, and a process temperature for the two-step wet etch process can be in a range from about 23° C. (e.g., room temperature) to about 67° C.

The pre-treatment can etch a byproduct and/or residue on the conductive feature barrier layers 52a, 52b, and 52c at a rate in a range from about 2 nm per minute to about 5 nm per minute, and can etch the conductive feature barrier layers 52a, 52b, and 52c at a rate in a range from about 0.3 nm per minute to about 0.6 nm per minute. A selectivity of the etching of the pre-treatment (e.g., a ratio of the etch rate of the byproduct and/or residue to the etch rate of the conductive feature barrier layers 52a, 52b, and 52c) can be in a range from about 2 to about 12. The second step can etch a byproduct and/or residue on the conductive feature barrier layers 52a, 52b, and 52c at a rate in a range from about 0.5 nm per minute to about 1 nm per minute, and can etch the conductive feature barrier layers 52a, 52b, and 52c at a rate in a range from about 0.3 nm per minute to about 1.5 nm per minute. A selectivity of the etching of the second step (e.g., a ratio of the etch rate of the byproduct and/or residue to the etch rate of the conductive feature barrier layers 52a, 52b, and 52c) can be in a range from about 0.3 to about 3.

The two-step wet etch process can be performed in situ in some examples. The example two-step wet etch process can be performed without inducing damage to the gate stacks 32, for example. Other etch processes with different process parameters may be used.

Figure 9:
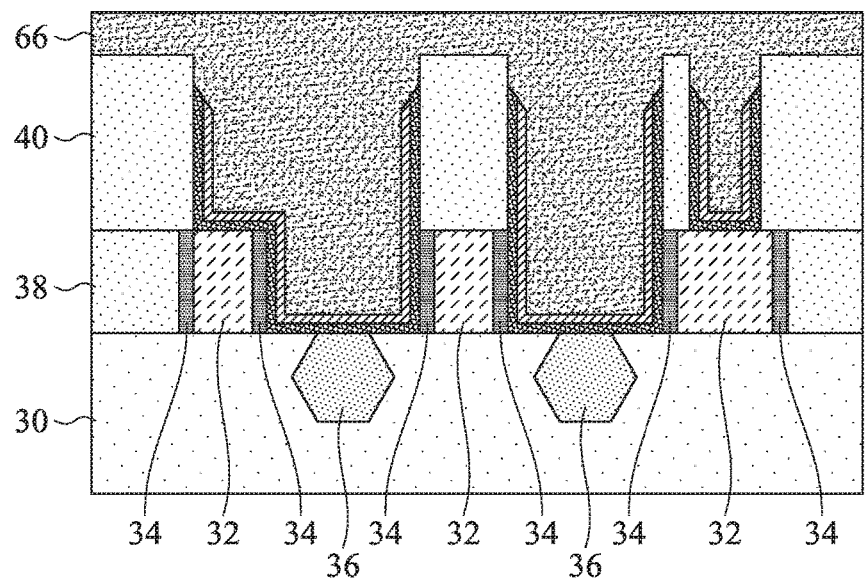

FIG. 9 illustrates the formation of conductive material 66 in the openings 42, 44, and 46 and on the modified conductive feature barrier layers 52a', 52b', and 52c'. The conductive material 66 may be or comprise a metal, such as tungsten, copper, aluminum, gold, silver, alloys thereof, the like, or a combination thereof, and may be deposited by CVD, ALD, PVD, or another deposition technique. The smoothing to form, e.g., the modified conductive feature barrier layers 52a', 52b', and 52c' can permit larger dimensions at upper portions of the openings 42, 44, and 46 compared to when the byproduct and/or residue is present (and, therefore, forming a constriction), and the larger dimensions can permit the conductive material 66 to better fill the openings 42, 44, and 46 without a void in the conductive material 66 in the openings 42, 44, and 46.

Figure 10:
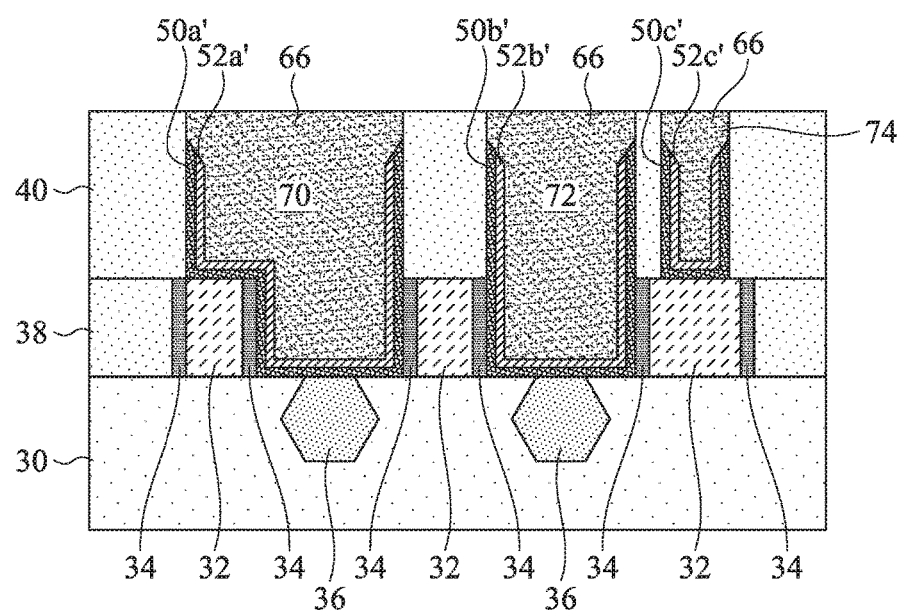

FIG. 10 illustrates the removal of excess conductive material 66. After the conductive material 66 is deposited, excess conductive material 66 over the top surface of the second ILD 40 may be removed by using a planarization process, such as a CMP, for example. The planarization process may remove excess conductive material 66 from above the top surface of the second ILD 40. This forms conductive features 70, 72, and 74 comprising the conductive material 66 in the openings 42, 44, and 46, respectively. Top surfaces of the conductive features 70, 72, and 74 and second ILD 40 may be coplanar. Accordingly, conductive features 70, 72, and 74 including the conductive material 66, barrier layers 52a', 52b', and 52c', and adhesion layers 50a', 50b', and 50c' (and, possibly, silicide regions) may be formed to corresponding gate stacks 32 and/or source/drain regions 36. As apparent from FIG. 10, the widths of the conductive material 66 of the conductive features 70, 72, and 74 at the top surfaces thereof are increased by pulling back the barrier layer 52 and the adhesion layer 50, which increases a surface area to which respective subsequent conductive features can make contact.

As shown by the preceding, aspects of some embodiments can be applied to Front End Of the Line (FEOL) and Middle End Of the Line (MEOL) processes. Conductive features 70, 72, and 74, including the processes by which the conductive features 70, 72, and 74 were formed, can implement aspects of various embodiments in FEOL and/or MEOL. Other conductive features formed in FEOL and/or MEOL processes may similarly incorporate aspects according to some embodiments. For example, replacement gate stacks can be formed according to some embodiments. For replacement gate stacks, for example, conformal layers, such as a dielectric layer and/or work-function tuning layer(s), that are formed where a dummy gate stack was removed can be deposited and pulled back according to the same or similar processes illustrated and described above with respect to FIGS. 4 through 8 for the adhesion layer 50 and the barrier layer 52, and the gate electrode may be deposited and formed like the conductive material 66 in FIGS. 9 through 10.

Figure 11:
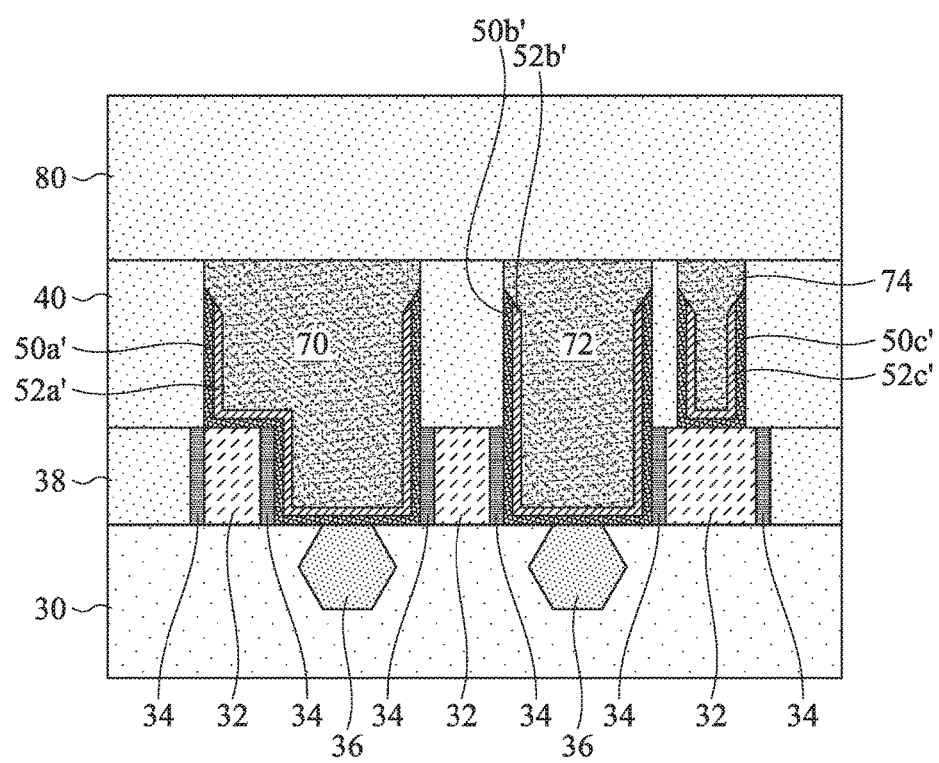

FIG. 11 illustrates the formation of an intermetallization dielectric (IMD) 80. The IMD 80 may include an etch stop layer (ESL) and a principal dielectric layer such as a low-k dielectric layer, for example. The IMD 80 is deposited over the second ILD 40 and conductive features 70, 72, and 74. For example, the etch stop layer may be deposited over the second ILD 40 and conductive features 70, 72, and 74. Then, for example, the principal dielectric layer is deposited over the etch stop layer. The etch stop layer and principal dielectric layer of the IMD 80 can be or include the same materials and can be deposited using the same techniques as described above with respect to the first ILD 38. The IMD 80 can be planarized after being deposited, such as by a CMP.

Figure 12:
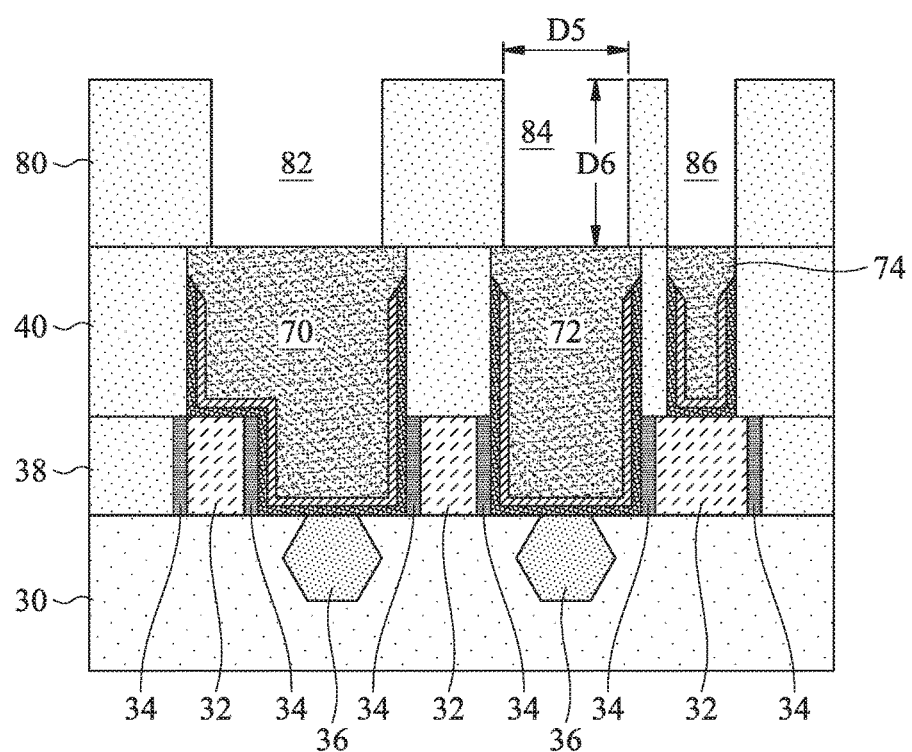

FIG. 12 illustrates the formation of openings 82, 84, and 86 through the IMD 80. The openings 82, 84, and 86 expose the conductive features 70, 72, and 74, respectively, and are for forming conductive features to the conductive features 70, 72, and 74, respectively. The openings 82, 84, and 86 may be formed using, for example, appropriate photolithography and etching processes. As an example, the opening 84 can have a fifth dimension D5 (e.g., a width) in a range from about 10 nm to about 40 nm, and can have a sixth dimension D6 (e.g., a height) in a range from about 30 nm to about 50 nm. An aspect ratio of the opening 84 (e.g., a ratio of the sixth dimension D6 to the fifth dimension D5) can be in a range from about 1 to about 5.

Figure 13:
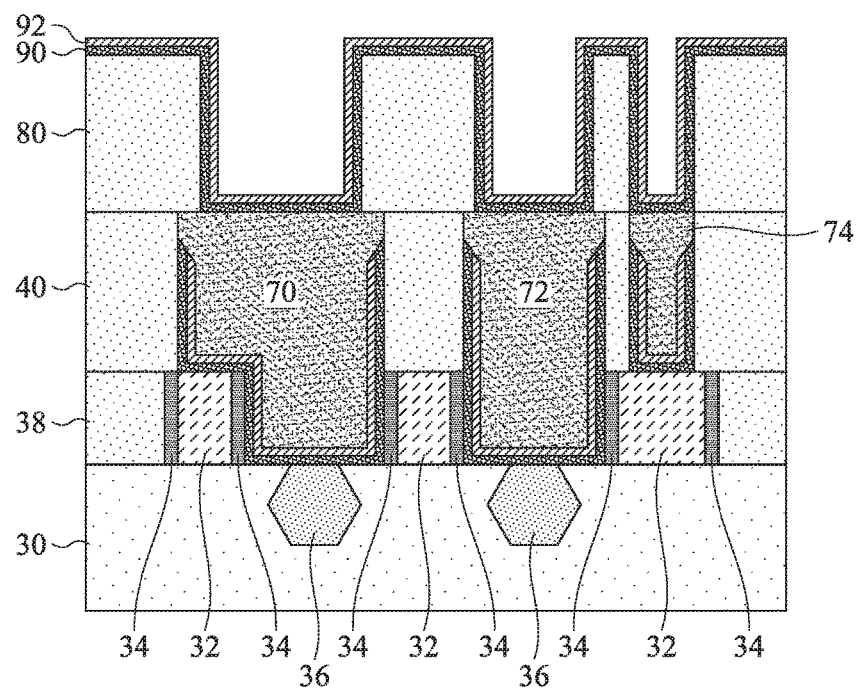

FIG. 13 illustrates the formation of an adhesion layer 90 conformally in the openings 82, 84, and 86, and a barrier layer 92 on the adhesion layer 90. The adhesion layer 90 layer is conformally deposited in the openings 82, 84, and 86, such as on the exposed conductive features 70, 72, and 74 and sidewalls of the IMD 80, and on the top surface of the IMD 80. The barrier layer 92 is conformally deposited on the adhesion layer 90. The adhesion layer 90 may be or comprise, for example, titanium, cobalt, nickel, the like or a combination thereof, and may be deposited by ALD, CVD, or another deposition technique. The barrier layer 92 may be or comprise titanium nitride, titanium oxide, tantalum nitride, tantalum oxide, the like, or a combination thereof, and may be deposited by ALD, CVD, or another deposition technique. The adhesion layer 90 and barrier layer 92 may have various thicknesses as described below following further processing.

Figure 14:
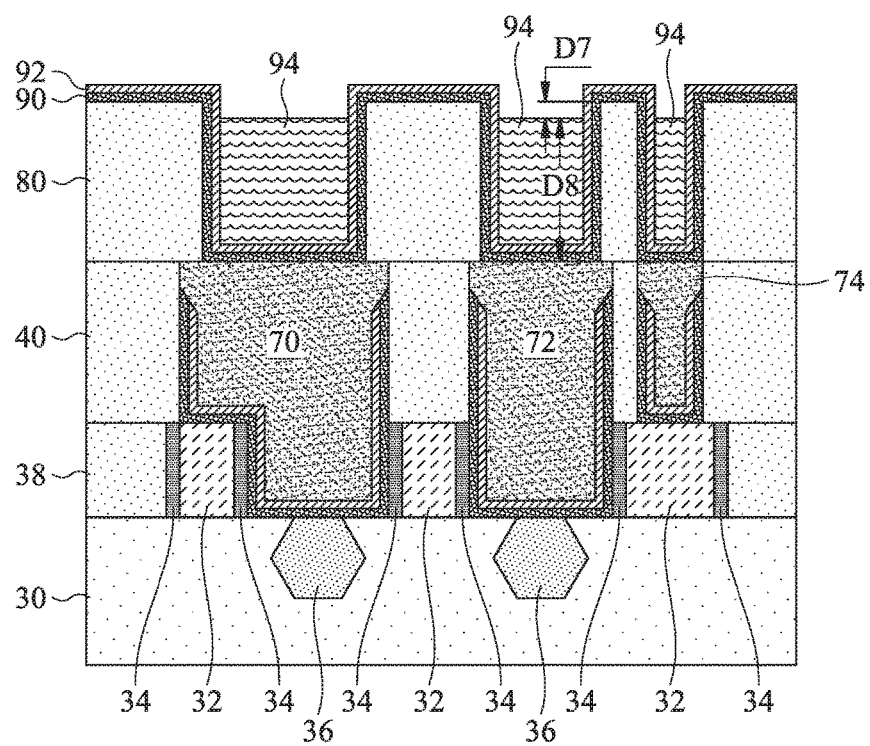

FIG. 14 illustrates the formation of a BARC 94 in the openings 82, 84, and 86 over the barrier layer 92. The BARC 94 may be, for example, an organic material or another material deposited by spin-coating or another deposition technique. The BARC 94 may be initially deposited in the openings 82, 84, and 86 and to a level above the top surface of the IMD 80 and/or above top surfaces of the barrier layer 92. The BARC 94 may subsequently be etched back to have top surfaces below the top surface of the IMD 80. The BARC 94 may be etched back to a seventh dimension D7 below the top surface of the IMD 80, which seventh dimension D7 can be in a range from about 10 nm to about 20 nm. Further, an eighth dimension D8 is from a bottom surface of the opening 84 (e.g., a top surface of the conductive feature 72 to which the opening 84 is formed) to the top surface of the BARC 94. A ratio of the eighth dimension D8 to the sixth dimension D6 is less than 1, such as less that about 0.5, and more particularly, in a range from about 0.2 to about 0.5.

The etch back may be or include a dry (e.g., plasma) etch process. The plasma etch process may include a RIE, NBE, ICP etch, the like, or a combination thereof. Example etchant gases that can be used for a plasma etch process include argon (Ar) gas or another etchant gas. The plasma etch process may be as described above with respect to FIG. 5.

Figure 15:
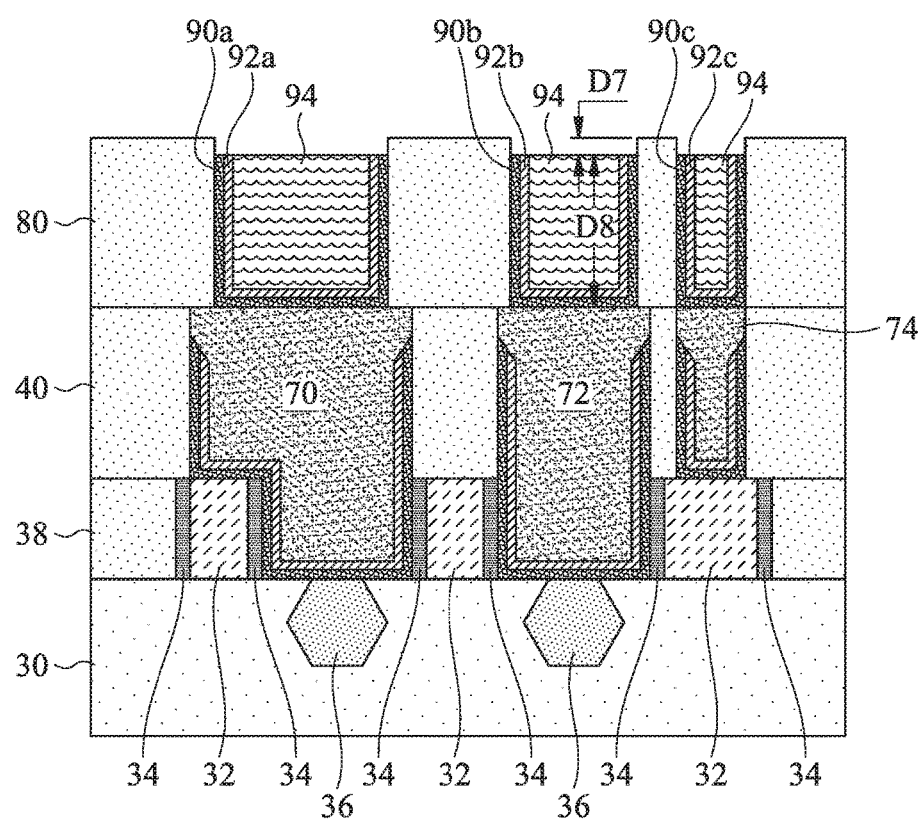

FIG. 15 illustrates the pulling back (e.g., removal by etching) of portions of the barrier layer 92 and the adhesion layer 90 above the top surfaces of the BARC 94 and at upper regions of the openings 82, 84, and 86. By removing the portions of the barrier layer 92 and the adhesion layer 90 above the top surfaces of the BARC 94 and at upper regions of the openings 82, 84, and 86, first, second, and third conductive feature adhesion layers 90a, 90b, and 90c and first, second, and third conductive feature barrier layers 92a, 92b, and 92c are formed in the first, second, and third openings 82, 84, and 86, respectively.

The portions of the barrier layer 92 and adhesion layer 90 may be removed using an etch process. The etch process can include a two-step wet etch process, such as the pretreatment and second step etching described above with respect to FIG. 6. The BARC 94 acts as a mask during the removal of the portions of the barrier layer 92 and the adhesion layer 90. Hence, top surfaces of, e.g., the second conductive feature adhesion layer 90b and second conductive feature barrier layer 92b can be at the seventh dimension D7 from the top surface of the IMD 80 and/or at the eighth dimension D8 from the bottom surface of the opening 84. Further, the top surfaces of the second conductive feature adhesion layer 90b and second conductive feature barrier layer 92b can be at a position that has the ratio of the eighth dimension D8 to the sixth dimension D6.

Figure 16:
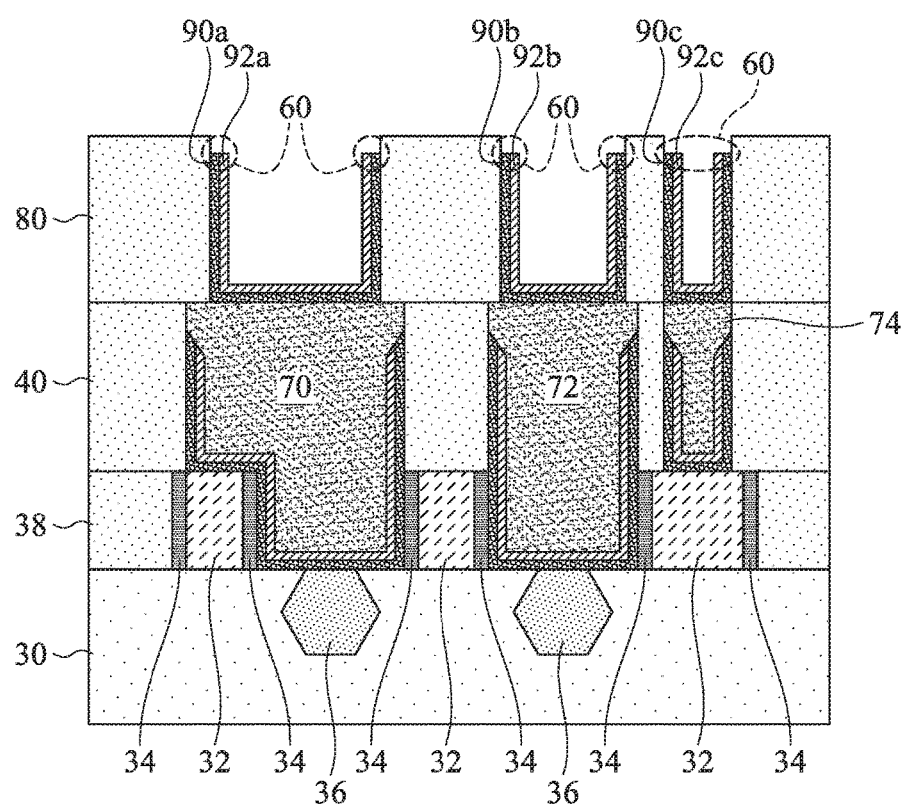

FIG. 16 illustrates the removal of the BARC 94. The BARC 94 may be removed by an ashing process, such as described above with respect to FIG. 7. After removal of the BARC 94, a residue and/or byproduct may be on upper surfaces of the conductive feature barrier layers 92a, 92b, and 92c interior to the respective openings 82, 84, and 86. The residue and/or byproduct are at profiles 60, an example of which is illustrated and described further with respect to FIG. 20 subsequently. The byproduct and/or residue may result from the removing (e.g., etching) of the portions of the barrier layer 92 and adhesion layer 90 in FIG. 15 and/or from the removing the BARC 94 in FIG. 16. The byproduct and/or residue can decrease a dimension of and/or constrict the respective openings 82, 84, and 86 at the upper portions of the conductive feature barrier layers 92a, 92b, and 92c. The first, second, and third conductive feature adhesion layers 90a, 90b, and 90c and first, second, and third conductive feature barrier layers 92a, 92b, and 92c may have various dimensions as described below with respect to FIG. 20.

Figure 17:
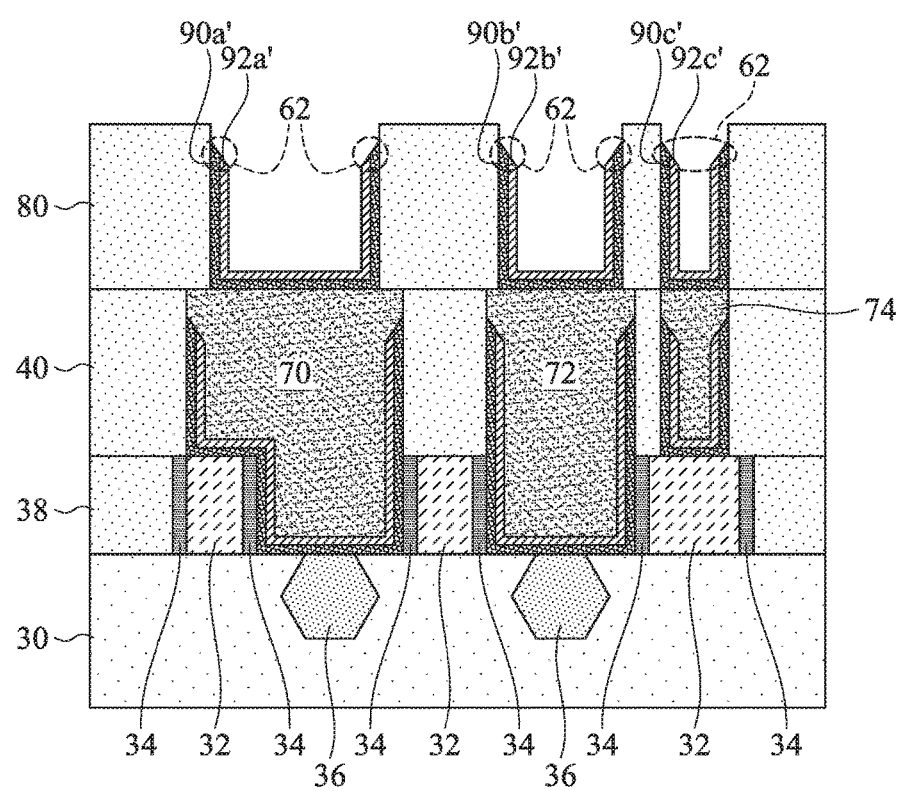

FIG. 17 illustrates subsequent pulling back (e.g., etching) of the conductive feature barrier layers 92a, 92b, and 92c and conductive feature adhesion layers 90a, 90b, and 90c to create modified conductive feature barrier layers 92a', 92b', and 92c' and modified conductive feature adhesion layers 90a', 90b', and 90c', respectively. The etching removes byproduct and/or residue from the surfaces of the upper portions of the conductive feature barrier layers 92a, 92b, and 92c, and can smooth (e.g., by tapering) the upper portions of the conductive feature barrier layers 92a, 92b, and 92c and conductive feature adhesion layers 90a, 90b, and 90c. The smoothing of the modified conductive feature barrier layers 92a', 92b', and 92c' and modified conductive feature adhesion layers 90a', 90b', and 90c' are at profiles 62, an example of which is illustrated and described further with respect to FIG. 21 subsequently. The etching can further tune heights of the modified conductive feature barrier layers 92a', 92b', and 92c' and modified conductive feature adhesion layers 90a', 90b', and 90c' (e.g., reducing the respective heights), such as by increasing a duration of the etching. The first, second, and third modified conductive feature adhesion layers 90a', 90b', and 90c' and first, second, and third modified conductive feature barrier layers 92a', 92b', and 92c' may have various dimensions as described below with respect to FIG. 21. The etching may be by a wet etch process, for example, such as described above with respect to FIG. 8.

Figure 18:
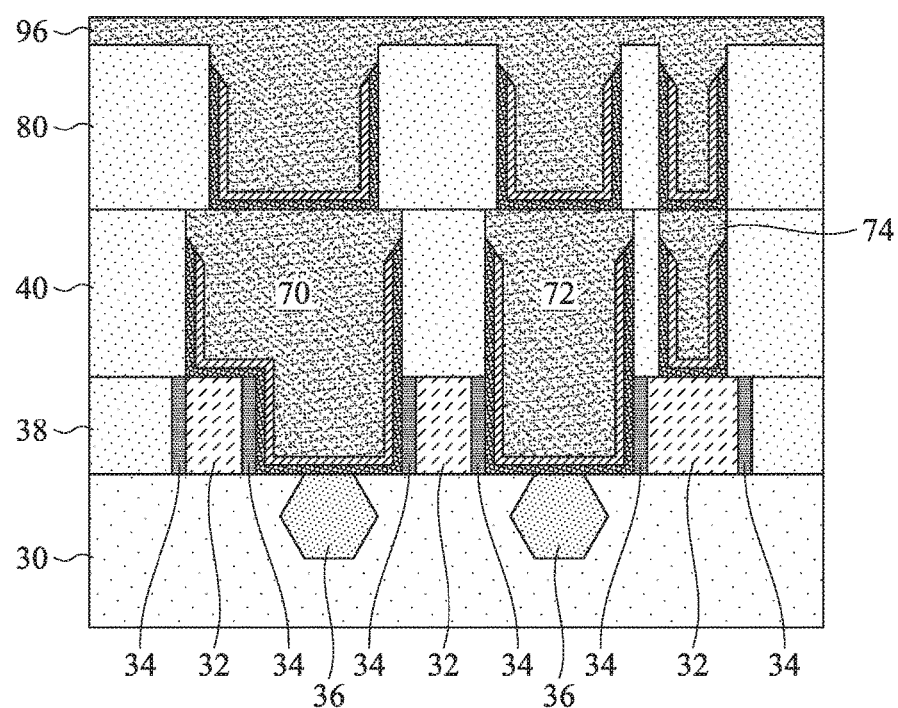

FIG. 18 illustrates the formation of conductive material 96 in the openings 82, 84, and 86 and on the modified conductive feature barrier layers 92a', 92b', and 92c'. The conductive material 96 may be or comprise a metal, such as tungsten, copper, aluminum, gold, silver, alloys thereof, the like, or a combination thereof, and may be deposited by CVD, ALD, PVD, or another deposition technique. The smoothing to form, e.g., the modified conductive feature barrier layers 92a', 92b', and 92c' can permit larger dimensions at upper portions of the openings 82, 84, and 86 compared to when the byproduct and/or residue is present (and, therefore, forming a constriction), and the larger dimensions can permit the conductive material 96 to better fill the openings 82, 84, and 86 without a void in the conductive material 96 in the openings 82, 84, and 86.

Figure 19:
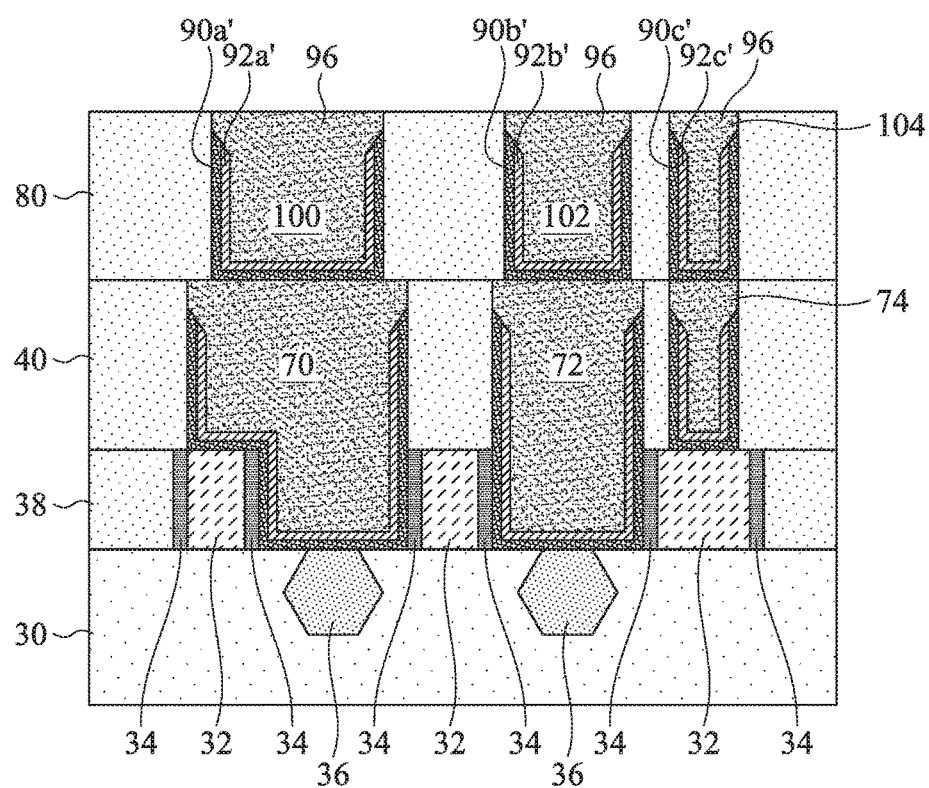

FIG. 19 illustrates the removal of excess conductive material 96. After the conductive material 96 is deposited, excess conductive material 96 over the top surface of the second ILD 40 may be removed by using a planarization process, such as a CMP, for example. The planarization process may remove excess conductive material 96 from above the top surface of the IMD 80. This forms conductive features 100, 102, and 104 comprising the conductive material 96 in the openings 82, 84, and 86, respectively. Top surfaces of the conductive features 100, 102, and 104 and second ILD 40 may be coplanar. Accordingly, conductive features 100, 102, and 104 including the conductive material 96, barrier layers 92a', 92b', and 92c', and adhesion layers 90a', 90b', and 90c' may be formed to corresponding conductive features 70, 72, and 74.

As shown by the preceding, aspects of some embodiments can be applied to Back End Of the Line (BEOL) processes. Conductive features 100, 102, and 104, including the processes by which the conductive features 100, 102, and 104 were formed, can implement aspects of various embodiments in BEOL processing. Other conductive features formed in BEOL processes may similarly incorporate aspects of according to some embodiments.

Figure 20:
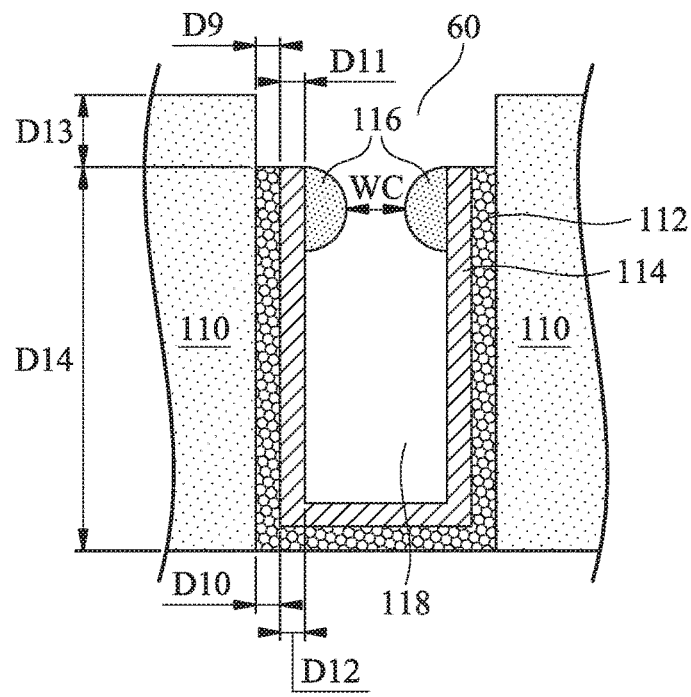
FIG. 20 is a profile of layers in an opening through a dielectric layer at an intermediate stage of an example method for forming a conductive feature in accordance with some embodiments.

FIG. 20 illustrates a profile 60 of an adhesion layer 112 and barrier layer 114 in an opening 118 through a dielectric layer 110 in accordance with some embodiments. The profile 60 may be formed during processing as shown in FIGS. 7 and 16. Byproduct and/or residue 116 is formed on upper surfaces of the barrier layer 114 interior to the opening 118. This byproduct and/or residue 116 can form as a result of etching the adhesion layer 112 and barrier layer 114, like in FIGS. 6 and 15, and/or as a result of removing a BARC, like in FIGS. 7 and 16. The byproduct and/or residue 116 constricts the opening 118, e.g., the byproduct and/or residue 116 decreases a dimension of the opening 118. For example, the opening 118 has a constricted width WC at an upper region of the barrier layer 114 due to the presence of the byproduct and/or residue 116.

The adhesion layer 112 has a ninth dimension D9 (e.g., a thickness at a top of the adhesion layer 112), which can be in a range from about 0.5 nm to about 1 nm, and has a tenth dimension D10 (e.g., a thickness at a bottom of the adhesion layer 112), which can be in a range from about 1 nm to about 2 nm. The ninth dimension D9 and tenth dimension D10 can be an as-deposited thickness of the adhesion layer 112 at the respective locations of the dimensions. A ratio of the tenth dimension D10 to the ninth dimension D9 can be in a range from about 1 to about 4. A thickness of the adhesion layer 112 along the sidewall of the opening 118 can decrease at a rate of 0.4 nm per 10 nm of depth from the thickness at the top of the adhesion layer 112 (e.g., ninth dimension D9) to the thickness at the bottom of the adhesion layer 112 (e.g., tenth dimension D10).

The barrier layer 114 has an eleventh dimension D11 (e.g., a thickness at a top of the barrier layer 114), which can be in a range from about 1.5 nm to about 2.5 nm, and has a twelfth dimension D12 (e.g., a thickness at a bottom of the barrier layer 114), which can be in a range from about 1.5 nm to about 2.5 nm. The eleventh dimension D11 and twelfth dimension D12 can be an as-deposited thickness of the barrier layer 114 at the respective locations of the dimensions. A ratio of the twelfth dimension D12 to the eleventh dimension D11 can be in a range from about 1 to about 1.7. A thickness of the barrier layer 114 along the vertical portion of the adhesion layer 112 can decrease at a rate of 0.2 nm per 10 nm of depth from the thickness at the top of the barrier layer 114 (e.g., eleventh dimension D11) to the thickness at the bottom of the barrier layer 114 (e.g., twelfth dimension D12).

The adhesion layer 112 and barrier layer 114 have respective top surfaces at a thirteenth dimension D13 from a top surface of the dielectric layer 110, and at a fourteenth dimension D14 from a bottom surface of the opening 118. The thirteenth dimension D13 corresponds with the third dimension D3 in FIG. 6 and the seventh dimension D7 in FIG. 14. The fourteenth dimension D14 corresponds with the fourth dimension D4 in FIG. 6 and the eighth dimension D8 in FIG. 14.

Figure 21:
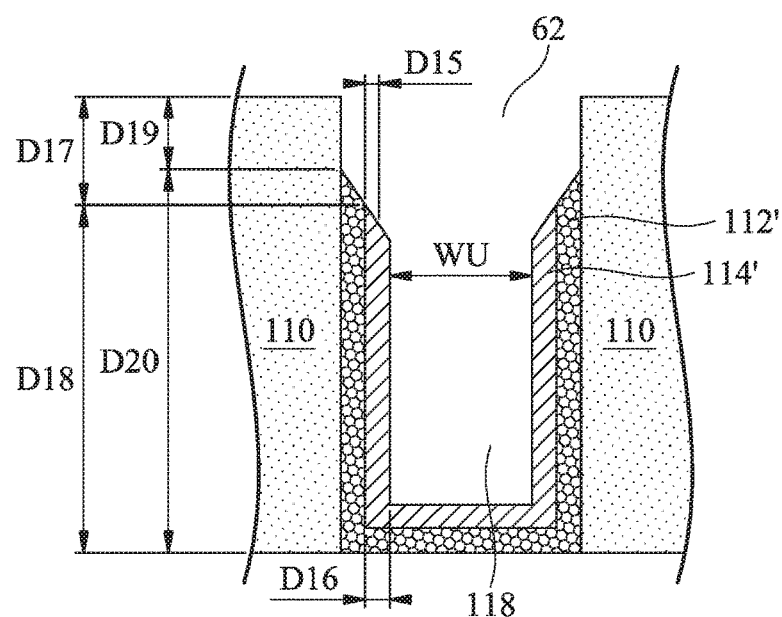
FIG. 21 is a profile of layers in an opening through a dielectric layer at an intermediate stage of an example method for forming a conductive feature in accordance with some embodiments.

FIG. 21 illustrates a profile 62 of a modified adhesion layer 112' and modified barrier layer 114' in the opening 118 through the dielectric layer 110 in accordance with some embodiments. The profile 62 may be formed during processing as shown in FIGS. 8 and 17. The etching described with respect to FIGS. 8 and 17 removes the byproduct and/or residue 116 from the upper surfaces of the barrier layer 114. Further, the etching may etch the barrier layer 114 and adhesion layer 112 to smooth or taper the barrier layer 114 and adhesion layer 112, which can result in the modified adhesion layer 112' and modified barrier layer 114'. This etch process can therefore remove the constriction of the opening 118 caused, at least in part, by the byproduct and/or residue 116. For example, the opening 118 in FIG. 21 has an upper width WU at an upper region of the modified barrier layer 114' that is greater than the constricted width WC in FIG. 20. For example, the upper width WU can be in a range from about 1 nm to about 5 nm greater than the constricted width WC.

The modified barrier layer 114' has a fifteenth dimension D15 (e.g., a thickness at a top of the modified barrier layer 114'), which can be in a range from about 0.2 nm to about 1.2 nm, and has a sixteenth dimension D16 (e.g., a thickness at a bottom of the modified barrier layer 114'), which can be in a range from about 1.5 nm to about 2.5 nm. A ratio of sixteenth dimension D16 to the fifteenth dimension D15 can be in a range from about 1 to about 10. A thickness of the modified barrier layer 114' along the vertical portion of the modified adhesion layer 112' can decrease at a rate of 0.5 nm per 10 nm of depth from the thickness at the top of the modified barrier layer 114' (e.g., fifteenth dimension D15) to the thickness at the bottom of the modified barrier layer 114' (e.g., sixteenth dimension D16).

A ratio of the fifteenth dimension D15 to the eleventh dimension D11 (e.g., a ratio of the thicknesses of the barrier layer 114 and 114' at the top after and before the etching) can be less than 1, such as in a range from about 0.1 to about 0.8. A ratio of the sixteenth dimension D16 to the twelfth dimension D12 (e.g., a ratio of the thicknesses of the barrier layer 114 and 114' at the bottom after and before the etching) can be less than 1, such as in a range from about 0.6 to about 0.9. In some examples, a rate of the thinning of the barrier layer 114 by the etching can be at a rate of about 0.3 nm to about 1.5 nm per minute. A change between the ratio ($R_{D12:D11}$) of the twelfth dimension D12 to the eleventh dimension D11 to the ratio ($R_{D16:D15}$) of sixteenth dimension D16 to the fifteenth dimension D15 (e.g., $R_{D12:D11}$ minus $R_{D16:D15}$) can be in a range from about 0.9 to about 1.

The modified adhesion layer 112' generally is not laterally etched because, in many examples, the modified barrier layer 114' remains on the modified adhesion layer 112'. However, in some examples, the modified adhesion layer 112' may be laterally etched where the modified barrier layer 114' is removed. In these examples, the modified adhesion layer 112' may have thicknesses altered as described above with respect to the modified barrier layer 114'.

The modified barrier layer 114' has a top surface at a seventeenth dimension D17 from the top surface of the dielectric layer 110, and at an eighteenth dimension D18 from the bottom surface of the opening 118. The modified adhesion layer 112' has a top surface at a nineteenth dimension D19 from the top surface of the dielectric layer 110, and at a twentieth dimension D20 from the bottom surface of the opening 118. The etching can cause the heights (e.g., the fourteenth dimension D14) of the barrier layer 114 and the adhesion layer 112 to be reduced, e.g., to the eighteenth dimension D18 and twentieth dimension D20, respectively. In some examples, the height of the barrier layer 114 is reduced more than the height of the adhesion layer 112 due to the barrier layer 114 being subjected to vertical and lateral etching at the top surface of the barrier layer 114, whereas the adhesion layer 112 is generally subjected to only vertical etching until the barrier layer 114 is laterally removed from the adhesion layer 112, which can then cause the adhesion layer to be subjected to lateral etching.

A difference between the fourteenth dimension D14 and the eighteenth dimension D18 (e.g., fourteenth dimension D14 minus eighteenth dimension D18), and conversely, a difference between the seventeenth dimension D17 and the thirteenth dimension D13 (e.g., seventeenth dimension D17 minus thirteenth dimension D13), can be in a range from about 1 nm to about 5 nm. Similarly, a difference between the fourteenth dimension D14 and the twentieth dimension D20 (e.g., fourteenth dimension D14 minus twentieth dimension D20), and conversely, a difference between the nineteenth dimension D19 and the thirteenth dimension D13 (e.g., nineteenth dimension D19 minus thirteenth dimension D13), can be in a range from about 1 nm to about 5 nm. A difference between the twentieth dimension D20 and the eighteenth dimension D18 (e.g., twentieth dimension D20 minus eighteenth dimension D18), and conversely, a difference between the seventeenth dimension D17 and the nineteenth dimension D19 (e.g., seventeenth dimension D17 minus nineteenth dimension D19), can be in a range from about 1 nm to about 5 nm.

Some embodiments can achieve advantages. By removing a constriction at an upper portion of an opening or recess (e.g., caused, at least in part, by a byproduct and/or residue), conductive material that will form a conductive feature can be more easily deposited in the opening or recess without a void being formed in the opening or recess. Particularly when dimensions of conductive features are small, voids in conductive features can cause higher resistance of the conductive features or complete failure of the conductive feature, such as by failing to establish electrical contact. Hence, mitigating void formation may be advantageous, particularly in small technology nodes, such as 7 nm and smaller. Further, heights of adhesion layers and barrier layers in conductive features can be better tuned in some embodiments by a second pull back.

An embodiment is a method. A barrier layer is formed along a sidewall. A portion of the barrier layer along the sidewall is etched back. After etching back the portion of the barrier layer, an upper portion of the barrier layer along the sidewall is smoothed. A conductive material is formed along the barrier layer and over the smoothed upper portion of the barrier layer.

Another embodiment is a structure. The structure includes a dielectric layer, a barrier layer, and a conductive material. The dielectric layer has a sidewall. The barrier layer is along the sidewall, and an upper surface of the barrier layer is below a top surface of the dielectric layer. A thickness of an upper portion of the barrier layer is less than a thickness of a lower portion of the barrier layer. The conductive material is along the barrier layer and over the upper surface of the barrier layer. The conductive material has a top surface that is coplanar with the top surface of the dielectric layer.

A further embodiment is a method. A dielectric layer is formed over a semiconductor substrate, and an opening is formed through the dielectric layer. A barrier layer is conformally formed in the opening. A first upper portion of the barrier layer is removed from the opening. A remaining upper portion of the barrier layer is in the opening after removing the first upper portion of the barrier layer. After removing the first upper portion of the barrier layer, the barrier layer is etched. A conductive material is formed on the barrier layer in the opening. A top surface of the conductive material is coplanar with a top surface of the dielectric layer, and the conductive material has a portion above the remaining upper portion of the barrier layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a barrier layer along a sidewall;
   etching back a portion of the barrier layer along the sidewall, wherein etching back the portion of the barrier layer exposes an upper portion of the sidewall;
   after etching back the portion of the barrier layer, smoothing an upper portion of the barrier layer along the sidewall; and
   forming a conductive material along the barrier layer, over the smoothed upper portion of the barrier layer, and along the upper portion of the sidewall.

2. The method of claim 1 further comprising forming an adhesion layer along the sidewall, the adhesion layer being disposed between the sidewall and the barrier layer.

3. The method of claim 1, wherein etching back the portion of the barrier layer comprises:
   forming a masking material along the barrier layer;
   etching the portion of the barrier layer along the sidewall and above the masking material; and
   removing the masking material.

4. The method of claim 1, wherein smoothing the upper portion of the barrier layer along the sidewall removes a residue, a byproduct, or a combination thereof of the etching back the portion of the barrier layer.

5. The method of claim 1, wherein smoothing the upper portion of the barrier layer along the sidewall decreases a thickness of the upper portion of the barrier layer along the sidewall.

6. The method of claim 1, wherein smoothing the upper portion of the barrier layer comprises using a wet etching process.

7. The method of claim 1, wherein smoothing the upper portion of the barrier layer comprises:
   performing a treatment of the barrier layer with a first etchant diluted in deionized water at one part of the first etchant to one hundred or more parts of deionized water; and
   after performing the treatment of the barrier layer, etching the barrier layer with a second etchant diluted in deionized water at one part of the second etchant to thirty or less parts of deionized water.

8. A method comprising:
   forming a dielectric layer over a semiconductor substrate;
   forming an opening through the dielectric layer;
   after forming the opening, forming a barrier layer conformally in the opening, the barrier layer extending along an uppermost sidewall of the opening;
   after forming the barrier layer, removing a first upper portion of the barrier layer from the uppermost sidewall of the opening, a remaining upper portion of the barrier layer being in the opening after removing the first upper portion of the barrier layer;
   after removing the first upper portion of the barrier layer, etching a portion of the barrier layer; and
   forming a conductive material on the barrier layer in the opening, a top surface of the conductive material being coplanar with a top surface of the dielectric layer, the conductive material having a portion above the remaining upper portion of the barrier layer.

9. The method of claim 8, wherein removing the first upper portion of the barrier layer from the opening comprises:
   forming a masking material in the opening and on the barrier layer, the masking material having a top surface below the top surface of the dielectric layer; and
   removing the first upper portion of the barrier layer from above the top surface of the masking material while the masking material is in the opening; and
   removing the masking material, wherein etching the barrier layer includes removing a residue, a byproduct, or a combination thereof resulting from the removing the first upper portion of the barrier layer, removing the masking material, or a combination thereof.

10. The method of claim 8, wherein etching the barrier layer decreases a thickness of the remaining upper portion of the barrier layer.

11. The method of claim 8, wherein etching the barrier layer comprises using a wet etching process.

12. The method of claim 8, wherein etching the barrier layer comprises:
performing a treatment of the barrier layer with a first etchant diluted in deionized water at one part of the first etchant to one hundred or more parts of deionized water; and
after performing the treatment of the barrier layer, etching the barrier layer with a second etchant diluted in deionized water at one part of the second etchant to thirty or less parts of deionized water.

13. The method of claim 8 further comprising forming an adhesion layer conformally in the opening, the barrier layer being formed conformally on the adhesion layer in the opening.

14. A method comprising:
forming a first dielectric layer over a semiconductor substrate;
forming an opening through the first dielectric layer;
forming a barrier layer in the opening;
forming a second dielectric layer over the barrier layer in the opening, wherein an upper portion of the barrier layer along an upper sidewall of the opening is exposed;
removing the upper portion of the barrier layer from the upper sidewall of the opening;
removing the second dielectric layer;
after removing the second dielectric layer, etching an upper portion of the barrier layer; and
forming a conductive material on the barrier layer in the opening, the conductive material extending over an upper surface of the barrier layer.

15. The method of claim 14, wherein the etching comprises:
etching using a first etchant; and
after etching using the first etchant, etching using a second etchant different than the first etchant.

16. The method of claim 14, wherein after removing the upper portion of the barrier layer, an upper surface of the barrier layer is between 10 nm and 20 nm below an upper surface of the first dielectric layer.

17. The method of claim 14, wherein forming the barrier layer comprises depositing the barrier layer using a conformal deposition process.

18. The method of claim 14, wherein the first dielectric layer extends over a first gate electrode and a second gate electrode, wherein the first dielectric layer does not extend between the barrier layer and the first gate electrode, wherein the first dielectric layer does not extend between the barrier layer and the second gate electrode.

19. The method of claim 14, further comprising, forming an adhesion layer, wherein forming the barrier layer comprises forming the barrier layer over the adhesion layer.

20. The method of claim 19, wherein after etching the barrier layer, the adhesion layer extends higher than the barrier layer.

* * * * *